US009248466B2

United States Patent
Pilch et al.

(10) Patent No.: US 9,248,466 B2
(45) Date of Patent: Feb. 2, 2016

(54) APPLICATION OF FLUIDS TO SUBSTRATES

(71) Applicant: Infineon Technologies AG, Neubiberg (DE)

(72) Inventors: Karl Pilch, Villach (AT); Hans Leitner, Landskron (AT); Michael Kalin, Treffen (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/891,644

(22) Filed: May 10, 2013

(65) Prior Publication Data

US 2014/0335699 A1    Nov. 13, 2014

(51) Int. Cl.
| | |
|---|---|
| *H01L 21/00* | (2006.01) |
| *B05C 11/02* | (2006.01) |
| *B05D 1/00* | (2006.01) |
| *B05D 3/00* | (2006.01) |
| *H01L 21/02* | (2006.01) |
| *H01L 21/67* | (2006.01) |
| *H01L 21/683* | (2006.01) |

(52) U.S. Cl.
CPC ............ *B05C 11/02* (2013.01); *B05D 1/002* (2013.01); *B05D 3/007* (2013.01); *H01L 21/02282* (2013.01); *H01L 21/6715* (2013.01); *H01L 21/67109* (2013.01); *H01L 21/6835* (2013.01); *H01L 2221/68327* (2013.01); *Y10T 156/10* (2015.01)

(58) Field of Classification Search
USPC ................................................. 438/781–783
See application file for complete search history.

(56) References Cited

U.S. PATENT DOCUMENTS

| | | | | |
|---|---|---|---|---|
| 5,127,362 | A * | 7/1992 | Iwatsu et al. | 118/667 |
| 5,450,205 | A * | 9/1995 | Sawin et al. | 356/632 |
| 6,034,771 | A * | 3/2000 | Rangarajan et al. | 356/450 |
| 6,103,141 | A * | 8/2000 | Incorvia et al. | 252/194 |
| 7,205,211 | B2 | 4/2007 | Aspar et al. | |
| 8,062,705 | B2 * | 11/2011 | Ou-Yang | 427/240 |
| 2011/0030772 | A1 * | 2/2011 | Veerasamy | 136/256 |

* cited by examiner

*Primary Examiner* — Richard Booth
(74) *Attorney, Agent, or Firm* — Slater & Matsil, L.L.P.

(57) ABSTRACT

Various embodiments relate to application of a fluid to a substrate. The fluid is locally heated, for example, to obtain a desired thickness profile.

10 Claims, 4 Drawing Sheets

(a) (b)

APPLICATION OF FLUIDS TO SUBSTRATES

TECHNICAL FIELD

The present application relates to apparatuses, methods and techniques related to the application of fluids to substrates.

BACKGROUND

In various industrial applications a fluid is applied to a substrate. One example from the semiconductor industry is the application of glue to a semiconductor wafer, for example, a silicon wafer, for mounting the same to a carrier like a glass carrier prior to carrying out a thinning process like a grinding or etching process.

In such processes, a thinning of the wafer has to be performed as uniform as possible, i.e., a total thickness variation (TTV) of the wafer after the thinning is kept at a minimum, for example, within a limit of ±3 μm. An uneven application of the glue may contribute to the total thickness variation.

Other fluids which may be applied to substrates in industrial processes include imides, lacquers or photoresists. Also, in such cases, a uniform application of the fluid on the substrate, for example, with a thickness variation within desired limits, may be desirable.

BRIEF DESCRIPTION OF THE DRAWINGS

Illustrative embodiments will be described with reference to the attached drawings, wherein:

FIGS. 3A and 3B, shows example measurement results for illustrating some features of some embodiments;

Figure 1:
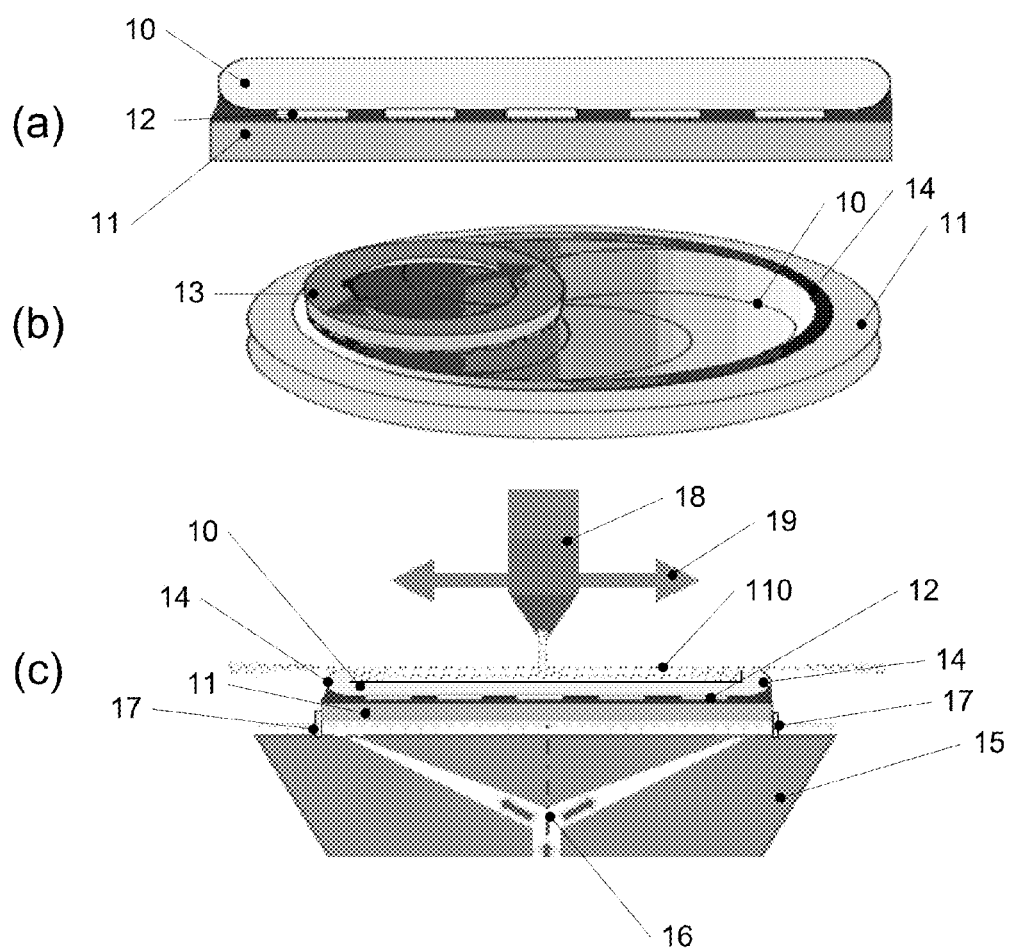
FIG. 1 schematically shows an example for an application where techniques, apparatuses, methods etc. according to embodiments may be applied.

In the following, embodiments will be described with reference to the attached drawings. These embodiments serve only as implementation examples and are not to be construed as limiting. For example, other embodiments may include less features, more features, alternative features etc. compared to the embodiments described and shown in the drawings. Moreover, features from different embodiments may be combined with each other unless noted otherwise to form further embodiments.

DETAILED DESCRIPTION OF ILLUSTRATIVE EMBODIMENTS

Embodiments described below relate to the application of a fluid to a substrate, i.e., a fluid having a viscosity which, as explained below, may be temperature-dependent. The fluid will also be referred to as viscous fluid in some embodiments, to indicate that the viscosity may be modified in such embodiments. This, however, does not imply any specific value of the viscosity of the fluid. Generally, the viscosity of a fluid is a measure of resistance to gradual deformation by shear stress or tensile stress and is heat-dependent. In various embodiments, by locally heating the fluid on the substrate, for example, by locally heating the substrate adjacent to the fluid, the viscosity of the fluid may be locally changed. In some embodiments, this may be used to locally adjust the thickness of the fluid on the substrate. Suitable fluids include, for example, glues, lacquers, imides, photoresists and the like. In one or more embodiments, a thickness variation of the fluid over the substrate may be reduced by local heating. In alternative embodiments, to obtain a suitable heating pattern or heating scheme a calibration may be used.

Turning now to the figures, in FIG. 1 an exemplary scenario where techniques, methods, apparatuses etc. discussed in the following with reference to FIGS. 2-5 may be employed. It should be noted that the application of these techniques, apparatuses and methods, however, is not limited to the scenario shown in FIG. 1, but may be applied in any situation where a viscous fluid is applied to a substrate.

In particular, FIG. 1 shows three stages (a), (b) and (c) of a thinning process of a semiconductor wafer 10, for example, a silicon wafer. Semiconductor wafer 10 is an example for a substrate usable in embodiments. Other substrates may, for example, include glass substrates.

In stage (a), substrate 10 is mounted to a carrier 11, for example, a solid carrier made of glass, metal, plastic or any other suitable material. To mount substrate 10 to carrier 11, a glue 12 is provided between substrate 10 and carrier 11. In the example shown, the glue is structured to form strips. In other embodiments, glue 12 may cover essentially the whole area (with a possible exception of a peripheral area) between substrate 10 and carrier 11.

In stage (b), substrate 10 mounted to carrier 11 is grinded by a grinding wheel 13 moving about the surface of substrate 10. In the example shown, an outer peripheral region 14 of substrate 10 is not grinded, thus leaving a thicker ring at the periphery of substrate 10 while the center region is thinned.

In stage (c), an etching is performed. To achieve this, substrate 10 together with carrier 11 are placed on a chuck 15 and are suspended within a ring 17 or within individual pins 17 on a gas cushion, for example, an air cushion. Gas for the gas cushion may be supplied via a channel 16. Chuck 15 may be rotatable or stationary. Etchant 110 is supplied via a nozzle 18, which nozzle 18 may be movable as indicated by an arrow 19 to perform a desired etching.

For some applications, high requirements regarding the total thickness variation of substrate 10 after the etching of stage (c) (possibly with the exception of peripheral region 14) may exist. For example, some applications may demand that a total thickness variation is ±3 μm or below. Each of the three stages (a), (b) and (c) may contribute to the final total thickness variation. For example, variations in thickness of glue 12 may cause the total thickness variation to increase. In some embodiments, for applying glue 12, techniques, apparatuses or methods described in the following with respect to FIGS. 2-5 may be used, which may help to reduce a thickness variation of glue 12 in some cases and therefore may contribute to a reduced total thickness variation.

Figure 2:
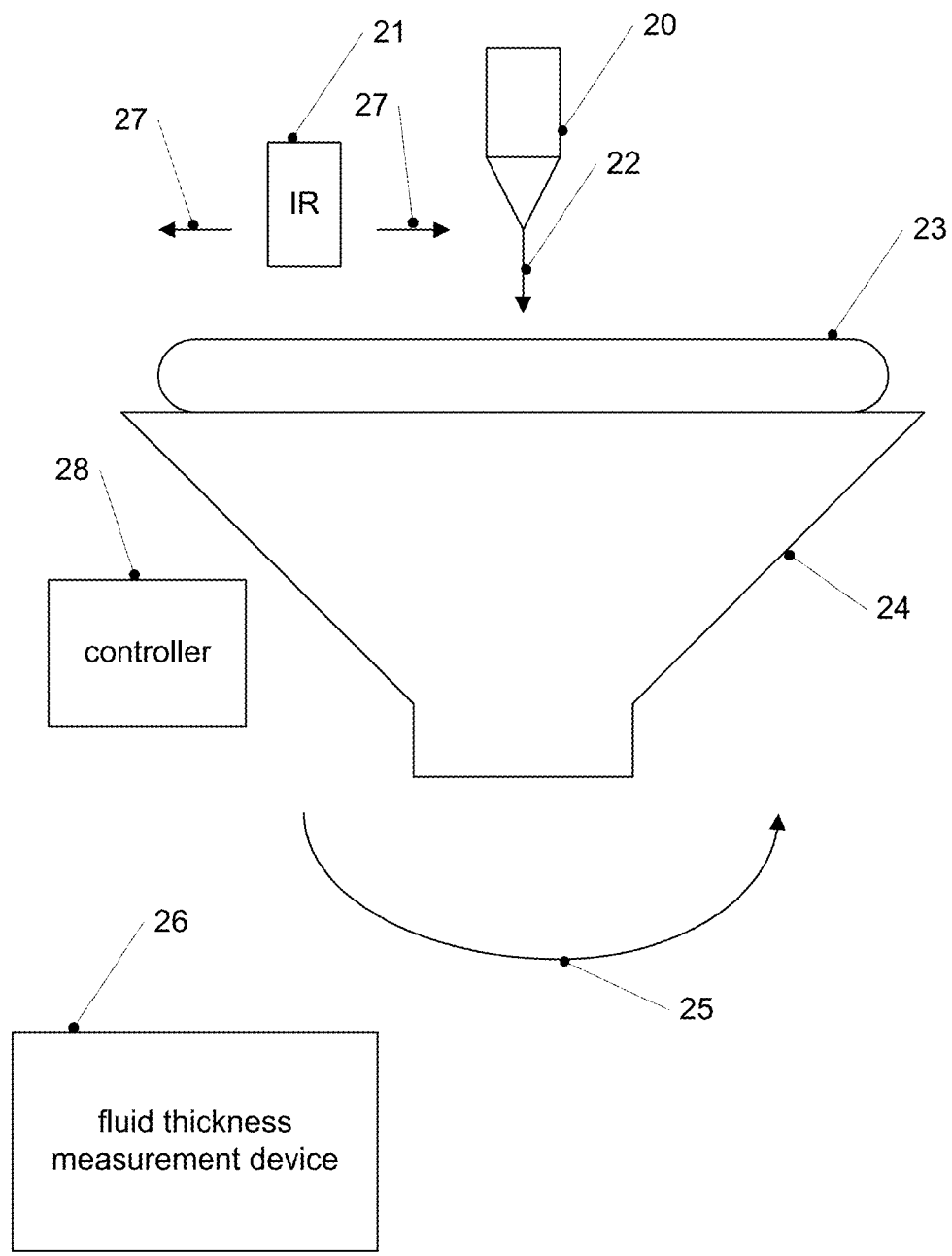
FIG. 2 schematically illustrates a fluid application apparatus according to an embodiment.

In FIG. 2, an apparatus is shown which is usable to apply a viscous fluid 22 to a substrate 23. In some embodiments, fluid 22 may be a glue, for example, glue 12 of FIG. 1. However, other viscous fluids may also be applied using the apparatus of FIG. 2, for example, imides, lacquers, photoresists and the like. In embodiments, fluid 22 has a temperature-dependent viscosity. For example, a viscosity of fluid 22 may be decreased when the fluid is heated.

In some embodiments, substrate 23 may be a semiconductor wafer like substrate 10 of FIG. 1. In other embodiments, still other substrates may be used. For example, substrate 23 may be a carrier like a glass carrier usable to receive a further substrate like a semiconductor wafer.

Substrate 23 is provided on a chuck 24 which is rotatable as indicated by an arrow 25. Rotation of chuck 24 may be controlled by a controller 28. Instead of chuck 24, in other embodiments, a different kind of holder for substrate 23 may be used. For example, in some embodiments a non-rotating holder may be used, and fluid application device 22 may move across the surface of substrate 23 to apply fluid 22. By locally heating fluid 22 to change its viscosity, the thickness profile may then change under the influence of gravity.

To apply fluid 22 to substrate 23, a fluid application device 20 (for example, comprising a nozzle) applies fluid 22 to substrate 23, for example, at or near a center of substrate 23, and by rotating chuck 24 and therefore substrate 23, fluid 22 is dispersed over substrate 23. In case of a high viscosity of fluid 22, this dispersion may lead to a comparatively uneven distribution of fluid 22, which may be undesirable.

In the apparatus of FIG. 2, a heating mechanism is provided to locally heat fluid 22. Such a local heating may, for example, be performed by locally heating substrate 23. Fluid 22 may then thermalize locally to the corresponding temperature of substrate 23, for example, in cases where a comparatively thin layer of fluid 22 is provided on substrate 23. In other embodiments, fluid 22 may be locally heated directly. In some embodiments, by locally heating fluid 22 a viscosity of fluid 22 may be modified, for example, lowered. For example, the fluid at ambient temperature, for example, room temperature, may be a highly viscous fluid showing non-Newtonian properties.

Generally, the behavior of a Newtonian fluid may be described by the laws of Navier-Stokes. A Newtonian fluid may have tensors that describe the viscous stress and strain rate which are related by a constant viscosity tensor that is independent of stress state and velocity of the flow. Non-Newtonian fluids differ from such a behavior. By locally heating the fluid, the viscosity of the fluid may be lowered, so it more closely resembles properties of a Newtonian fluid. Movement of Newtonian fluids is well understood and can be controlled more easily than the movement of non-Newtonian fluids. As mentioned above, Newtonian fluids follow the laws of Navier-Stokes. Even if the fluid is not strictly Newtonian, through heating the properties may resemble Newtonian properties more, which in some embodiments may make control of the behavior of fluid 22, for example, control of its thickness across substrate 23, easier.

In the apparatus of FIG. 2, as a heating mechanism an infrared light source 21 is provided which is movable as indicated by arrows 27 to locally heat substrate 23 and fluid 22 dispersed thereon. Controller 28 may control movement and/or intensity of infrared lamp 21. In other embodiments, controller 28 may control the operation of a different heating mechanism. In some embodiments, controller 28 may be implemented by programming a microprocessor-based device like a computer accordingly. In other embodiments, an infrared lamp comprising a plurality of segments and covering essentially a whole radius of substrate 23 from center to periphery may be provided, and local heating, in this case heating at a desired distance from the center of substrate 23, may be achieved by activating corresponding segments of the infrared lamp. Through rotation of substrate 23, together with chuck 24, then a radially symmetric heating profile may be obtained in some embodiments. In other embodiments, other heating mechanisms may be provided, for example, a resistive heating (electrical heating) provided in chuck 24 to heat substrate 23 and therefore fluid dispersed on the substrate.

Furthermore, in the apparatus of FIG. 2 an optional fluid thickness measurement device 26 is provided. Using fluid thickness measurement device 26, a thickness of the fluid 22 on substrate 23 may be measured, for example, via optical means like ellipsometry or other reflective techniques, or via tactile techniques or ultrasonic techniques. Generally, any conventional technique may be used for layer thickness measurement. In some embodiments, to obtain a desired thickness profile of fluid 22 on substrate 23, fluid 22 is applied to substrate 23 and the thickness across the substrate is measured by device 26.

When there are deviations from a desired thickness profile a local heating via infrared lamp 21 may be performed. In some embodiments, such a local heating may be performed at locations where a thickness of fluid 22 on substrate 23 is greater than a desired thickness. This process, i.e., measuring the thickness and applying or adjusting local heating, may be repeated until a desired thickness profile is reached. In some embodiments, a pattern or scheme of heating (for example, positions of infrared lamp 21, duration and intensity of heating etc.), or segments which are activated in case of a segmented heating, current in case of a resistive heating etc., during this process may be stored and used later, for example, during a production process to apply fluid to substrates with a desired thickness profile.

A calibration as described above, i.e., determining and storing a pattern or scheme of heating, may be repeated, for example, in regular intervals like once a week, after a predetermined quantity of substrates processed or after control measurements indicate that a desired thickness profile, for example, a profile which is flat within a certain tolerance, is not obtained any longer.

Figure 3:
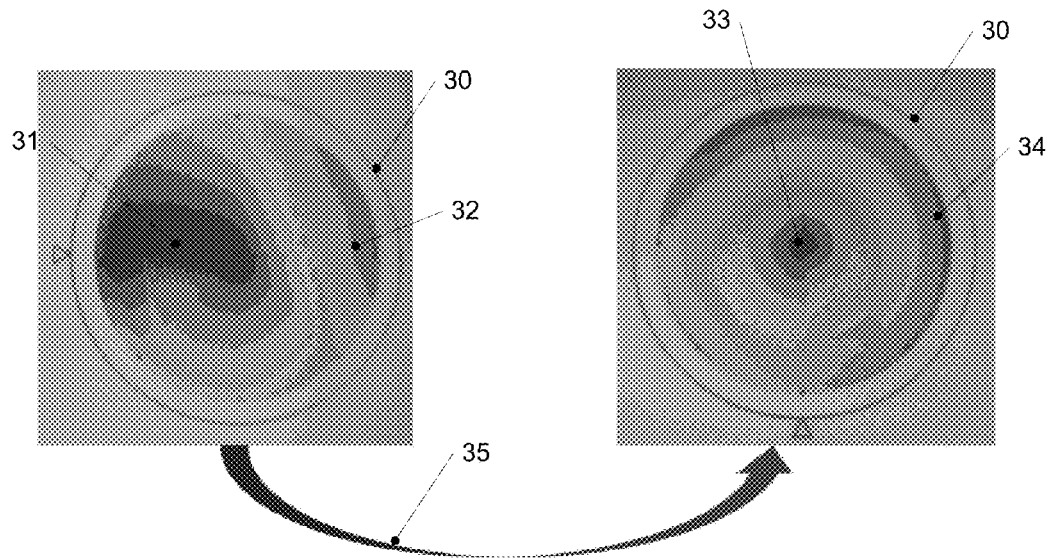
FIG. 3, which includes

FIG. 3 shows measurement results to illustrate the effect of local heating.

In FIG. 3(a), glue has been applied to a substrate 30. A glue thickness in an area labeled 31 was generally lower than a glue thickness in an area labeled 32. The thickness differences were of the order of a few micrometers.

Following this, local heating at the center of substrate 30 was applied while rotating the substrate, which is symbolized by an arrow 35. The result is shown in FIG. 3(b). Here, the thickness of the glue at the center 33 is lowest, while the thickness is highest at a peripheral region 34. The thickness differences in this case were some ten micrometers. This shows that by local heating, the thickness distribution of a viscous fluid like a glue may be influenced. For example, by adjusting the intensity of the heating the effect may be fine-tuned to the needs of a specific application.

Figure 4:
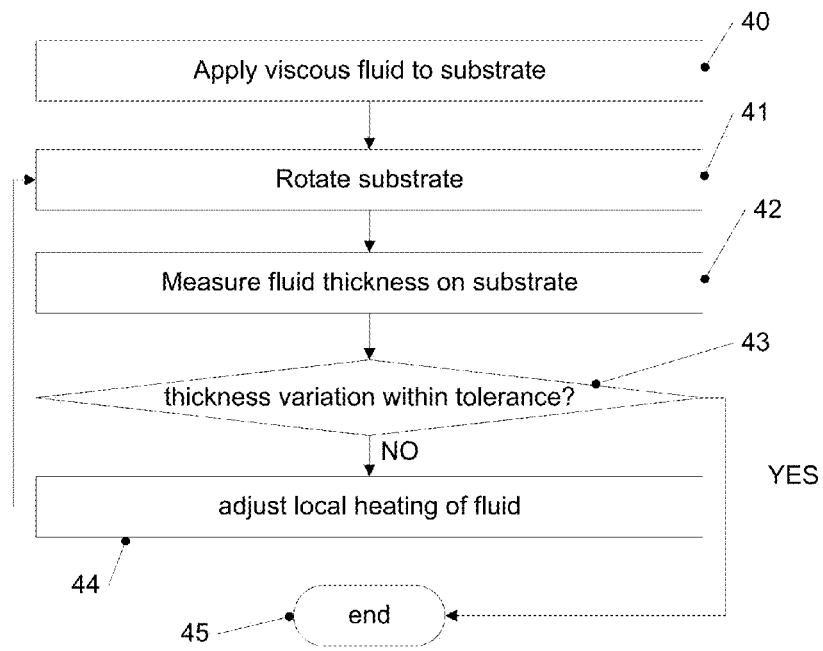
FIG. 4 illustrates a method according to an embodiment.
Figure 5:
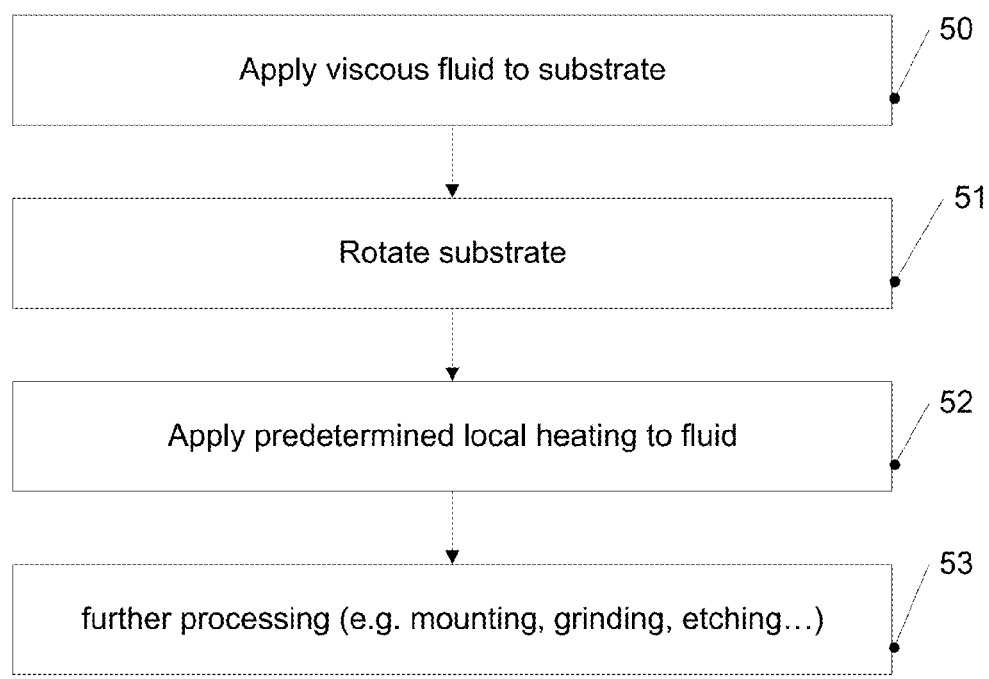
FIG. 5 illustrates a server method according to an embodiment.

In FIGS. 4 and 5, flowcharts illustrating methods according to some embodiments are depicted. While the methods are illustrated as a series of acts or events, it should be noted that embodiments are not limited to the order of these acts or events shown. In other embodiments, a different order may be used, or some of the acts or events shown may be performed concurrently with each other. For example, in some embodiments, an application of a viscous fluid to a substrate and a rotating of the substrate are shown in separate boxes one after the other, although these acts may also be performed concurrently with each other, or a rotation may start prior to the application of the fluid.

In FIG. 4, a method for calibration of a local heating of a fluid being applied to a substrate is shown. The method of FIG. 4 may, for example, be implemented using the apparatus of FIG. 2, but may also be used using other apparatuses or devices which enable a local heating of a fluid applied to a substrate.

At 40, a viscous fluid is applied to a substrate. The viscous fluid may, for example, comprise a glue, an imide, a lacquer or a photoresist. The viscous fluid may have a temperature-dependent viscosity. In some embodiments, the viscous fluid may exhibit a non-Newtonian behavior at ambient temperature, e.g., room temperature.

In some embodiments, the substrate may be a semiconductor wafer like a silicon wafer. In other embodiments, other kinds of substrates, for example, glass substrates, or carriers to receive further substrates, may be used.

At 41, the substrate is rotated, which is also sometimes referred to as spinning, to disperse the substrate on the wafer. In other embodiments, the fluid may be dispersed by other methods than spinning, for example, by moving a fluid application device across the surface of the substrate.

At 42, a fluid thickness on the substrate is measured.

At 43, it is checked if the measured fluid thickness corresponds to a desired thickness profile. For example, it is checked if the thickness variation of the fluid is within a desired tolerance, for example, ±1 µm, ±3 µm, or ±5 µm. However, other desired thickness profiles than a flat profile with a thickness variation within a tolerance may also be used in embodiments.

If the thickness profile corresponds to a desired profile, the method is ended at 45. Otherwise, a local heating of the fluid on the substrate is adjusted at 44. For example, portions where a thickness exceeds a desired thickness or a mean thickness by more than a desired amount may be locally heated, e.g., by some degrees centigrade to increase a viscosity of the fluid at these locations. Adjusting of a local heating may, for example, comprise moving an infrared lamp to desired locations, activating desired lamp segments, activating resistive heating elements, adjusting a power of infrared lamps or a magnitude of a heating current etc.

After that, the method goes back to 41 and is repeated until at 43 the thickness profile corresponds to a desired behavior. The heating pattern or scheme obtained by various adjustments at 44 may be stored to be used later during production, for example, during the method illustrated in FIG. 5 to be described later.

In FIG. 5, a flowchart illustrating a method according to a further embodiment is shown. At 50, a viscous fluid is applied to a substrate. The viscous fluid may, for example, comprise a glue, an imide, lacquer, a photoresist or the like. In embodiments, the viscous fluid may have a temperature-dependent viscosity. In some embodiments, at ambient temperature the viscous fluid may exhibit a non-Newtonian behavior. In some embodiments, the substrate may comprise a semiconductor wafer like a silicon wafer. In other embodiments, the substrate may be a different type of substrate, for example, a glass substrate.

At 51, the substrate is rotated to disperse the fluid on the substrate. In other embodiments, other techniques may be used to disperse the fluid on the substrate.

At 52, a predetermined local heating is applied to the fluid. In some embodiments, the predetermined local heating may have been determined by a calibration process, for example, the method as explained with reference to FIG. 4. In other cases, the predetermined local heating may be preset for specific substrate types and/or fluid types. In some embodiments, the predetermined local heating may be applied while the substrate is rotating. In some embodiments, by applying the predetermined local heating a thickness variation of the fluid on the substrate is reduced, for example, reduced below a desired tolerance.

Optionally, at 53 further processing may be performed. For example, the processing illustrated with respect to FIG. 1 may be performed in case the fluid is a glue, i.e., the substrate may be mounted to a carrier, and a grinding and/or etching may be performed. For other kinds of fluids, other kinds of processing may be performed. For example, in case the fluid is a photoresist, a photolithography may be performed.

As can be seen from the above description of modifications and alterations, the embodiments shown serve only illustrative purposes and are not to be construed as limiting the scope of the present application in any way. In particular, the techniques, concepts and schemes described herein may be implemented in a manner different from the manners shown.

What is claimed is:

1. A method comprising:
applying a glue to one of a semiconductor substrate or a carrier;
dispersing the glue on the one of the substrate or the carrier;
applying a predetermined local heating to the glue while dispersing the glue on the one of the substrate or the carrier to obtain a desired thickness profile, wherein the desired thickness profile is a flat profile within a predetermined tolerance;
mounting the other one of the substrate or the carrier onto the one of the substrate or the carrier with the glue sandwiched between the substrate and the carrier; and
grinding the substrate while the substrate is mounted to the carrier.

2. The method of claim 1, wherein dispersing the glue comprises rotating the substrate.

3. The method of claim 1, wherein the predetermined local heating is determined by calibration.

4. The method of claim 1, wherein applying the predetermined local heating comprises locally heating the substrate.

5. A method comprising:
applying a glue to one of a semiconductor substrate or a carrier;
dispersing the glue over the one of the substrate or the carrier;
measuring a glue thickness of the glue over the one of the substrate or the carrier;
adjusting a local heating of the glue according to a spatial heat pattern across the one of the substrate or the carrier while dispersing the glue on the substrate to obtain a desired thickness profile of the glue, wherein the desired thickness profile is a flat profile within a predetermined tolerance;
mounting the other one of the substrate or the carrier onto the one of the substrate or the carrier with the glue sandwiched between the substrate and the carrier; and
grinding the substrate while the substrate is mounted to the carrier.

6. The method of claim 5, wherein adjusting and measuring are repeated until the glue thickness matches the desired thickness profile.

7. The method of claim 5, further comprising storing a local heating pattern based on the adjustment.

8. The method of claim 5, wherein the glue exhibits an essentially non-Newtonian behavior at ambient temperature.

9. The method of claim 5, wherein the local heating comprises irradiating the glue with infrared radiation.

10. The method of claim 5, wherein the local heating comprises electrically heating the glue.

\* \* \* \* \*